United States Patent
Duong

(10) Patent No.: US 7,812,664 B1
(45) Date of Patent: Oct. 12, 2010

(54) METHOD OF AND CIRCUIT FOR SUPPRESSING NOISE IN A CIRCUIT

(75) Inventor: Anthony T. Duong, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 391 days.

(21) Appl. No.: 11/880,198

(22) Filed: Jul. 19, 2007

(51) Int. Cl.
*H03B 1/00* (2006.01)
*H04B 1/10* (2006.01)

(52) U.S. Cl. .................................. 327/551; 327/310

(58) Field of Classification Search ................ None
See application file for complete search history.

(56) References Cited

U.S. PATENT DOCUMENTS 6,191,647 B1   2/2001   Tanaka et al.
6,404,234 B1   6/2002   Hsu et al.
2002/0075038 A1*  6/2002   Mathew et al. ................ 326/95
2003/0025524 A1   2/2003   Amick et al.
2003/0085752 A1*  5/2003   Rader et al. .................. 327/536

FOREIGN PATENT DOCUMENTS

EP          0534719 A       3/1993

* cited by examiner

*Primary Examiner*—Lincoln Donovan
*Assistant Examiner*—Khareem E Almo
(74) *Attorney, Agent, or Firm*—John J. King

(57) ABSTRACT

A method of suppressing noise in a circuit is disclosed. The method comprises providing a supply voltage to a first terminal of the circuit; providing a ground voltage to a second terminal of the circuit; providing a clock signal to the circuit; and actively decoupling noise from at least one of the first terminal and the second terminal of the circuit by actively decoupling noise synchronously with the clock signal. A circuit for suppressing noise in a circuit is also disclosed.

20 Claims, 4 Drawing Sheets

METHOD OF AND CIRCUIT FOR SUPPRESSING NOISE IN A CIRCUIT

FIELD OF THE INVENTION

The present invention relates generally to integrated circuits, and in particular, to a method of and circuit for suppressing noise in a circuit.

BACKGROUND OF THE INVENTION

Integrated circuit devices typically have a number of input/output pins to generate output signals. Output signals of an integrated circuit are typically switched simultaneously in response to a clock signal. Such simultaneously switching of outputs results in large transient currents which are often difficult to control. In particular, power and ground noise, which comprises undesirable signals on a line, is generated in on-chip power and ground buses when the signals at the outputs switch logic states simultaneously. When a significant number of drivers switch at the same time, an increased current draw on the power supply may cause a droop or negative spike in the voltage supply to the chip. This dip in power supply voltage may propagate as noise through both active and quiet drivers, and may cause false switching in the system. With system speeds increasing and the demands to transmit more data, destructive switching noise has become a significant concern.

Jitter in a clock signal, caused by thermal noise or external interference through the power or ground lines may also have a significant impact on the operation of a circuit. For example, period jitter, also known as "edge-to-edge" jitter, is the deviation in time of any clock period from the ideal clock period. Period jitter results in phase variations with respect to a perfect reference clock or data signal as a result of noise. The period jitter is usually measured as the difference between the longest period and the shortest period. Accommodating for period jitter is necessary to ensure that there is adequate setup time for all of the signals. Jitter may also arise from simultaneous switching of internal logic that are not part of the input/output (I/O) elements, such as configurable logic blocks (CLBs) or blocks of Random Access Memory (BRAMs) of a programmable logic device (PLD), which will be described in more detail below. Accordingly, it is necessary to overcome large transients resulting from simultaneous switching noise or thermal noise resulting in clock jitter, and provide noiseless power and ground connections.

Supply noise suppression has been done in conventional circuits with passive components, such as capacitors connected across the power supply rail and ground. The capacitor provides a shunt path for transient noise on the supply rail to ground to minimize transient voltage amplitude, while storing and providing a local charge to minimize voltage droop. However, the performance of passive devices is limited by their parasitic inductance, series resistance, and capacitance which are functions of the type of material used, packaging, temperature, DC bias, and operating frequency. Further, because a capacitor becomes inductive past its resonant frequency, a given capacitor value is typically optimal for one resonant frequency, but not over a wide range of frequencies. In addition, due to parasitic resistance and inductance, the performance of passive devices tends to degrade rapidly at frequencies above 100 Mhz.

Accordingly, there is a need for an improved method of and circuit for suppressing noise in a circuit.

SUMMARY OF THE INVENTION

A method of suppressing noise in a circuit is disclosed. The method comprises providing a supply voltage to a first terminal of the circuit; providing a ground voltage to a second terminal of the circuit; providing a clock signal to the circuit; and actively decoupling noise from at least one of the first terminal and the second terminal of the circuit by actively decoupling noise synchronously with the clock signal. Actively decoupling noise may comprise shunting the first terminal of the circuit to a voltage greater than the supply voltage and/or shunting the second terminal of the circuit to a voltage less than ground. An offset from the clock signal may also be provided for actively decoupling noise, which may be performed during a predetermined portion of the clock period.

According to an alternate embodiment, a method of suppressing noise in a circuit comprises providing a supply voltage to a first terminal of the circuit; providing a ground voltage to a second terminal of the circuit; and actively decoupling noise from at least one of the first terminal or the second terminal of the circuit by selectively shunting at least one of the first terminal or the second terminal to a voltage having a greater magnitude during switching of a signal at an output. The method may further comprise providing a clock signal to the circuit, wherein active decoupling noise comprises decoupling noise synchronously with the clock signal. Further, actively decoupling noise may comprise shunting the first terminal to a voltage greater than the supply voltage and shunting the second terminal to a voltage less than ground.

A circuit for suppressing noise at a terminal is also disclosed. The circuit comprises a clock signal coupled to a clock input; a supply voltage coupled to a first terminal; a ground voltage coupled to a second terminal; and a switching circuit coupled to at least one of the first terminal and the second terminal to actively decoupling noise from the first terminal or the second terminal of the circuit by actively decoupling noise synchronously with the clock signal. The device may further comprise a first switch coupled between the first terminal and a voltage which is greater than the supply voltage and a second switch coupled between the second terminal and a voltage which is less than ground. A programmable pulse generator for adjusting the phase and pulse width of a pulse for decoupling noise synchronously with the clock signal may also be provided.

DETAILED DESCRIPTION OF THE DRAWINGS

Figure 1:
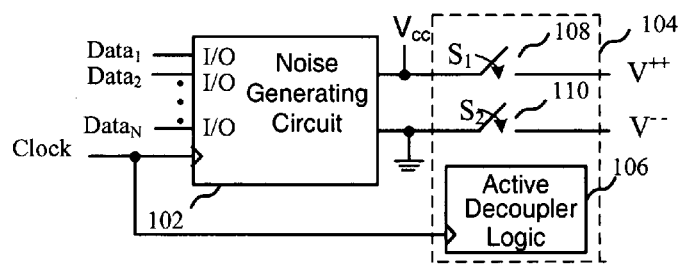
FIG. 1 is a block diagram of a circuit for suppressing noise according to an embodiment the present invention.

Turning first to FIG. 1, a block diagram of a circuit for suppressing noise according to an embodiment the present invention is shown. In particular, a noise generating circuit 102 is coupled to receive a supply voltage $V_{cc}$ and a clock signal, and is coupled to a ground voltage. According to the embodiment of FIG. 1, the circuit is also coupled to receive a first voltage, called a highly positive voltage $V^{++}$, which is a voltage that is greater than $V_{cc}$, and second voltage, called a highly negative $V^{--}$, which is a voltage that is less than ground. By way of example, for a 2.5 volt $V_{cc}$, $V^{++}$ may be 3.3 volts and $V^{--}$ may be −1.2 volts. An active decoupling circuit 104 comprises active decoupler logic 106 which generates control signals S1 and S2 to control switches 108 and 110, respectively. The active decoupler logic is coupled to receive the clock signal and preferably comprises a pulse width generator circuit to generate the appropriate control signals S1 and S2. As will be described in more detail below, the use of active devices, such as switches 108 and 110, for selectively coupling $V^{++}$ and $V^{--}$ to the circuit in response to control signal S1 and S2 provides improved suppression of noise on the power and ground terminals. Accordingly, a voltage having a greater magnitude is coupled to the supply voltage and ground voltage, where a voltage having a more positive value than the supply voltage is applied to the supply terminal and a voltage having a more negative value than ground is applied to the ground terminal. A voltage having a greater magnitude may be applied to either the supply voltage, the ground voltage or both. Unlike passive devices, active de-couplers shunt the noisy supply voltage to a clean and stable alternate local voltage reference for a finite amount of time to suppress the ripple present on the noisy supply. The clean power supply provides a large local supply of charge so to minimize voltage droop, and the low-ripple supply voltage reference that serves to stabilize the noisy supply. The switches enabling active decoupling may be low on-resistance transistors, typically 0.001 ohm or less, for example, that are controlled by a pulse generator circuit which determines when the transistors are turned on or off. The generation of the pulses for controlling the switches will be described in more detail in reference to FIGS. 4-7.

Figure 2:
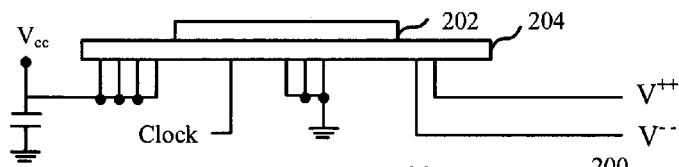
FIG. 2 is a block diagram of an integrated circuit package having a circuit for suppressing noise according to an embodiment of the present invention.

According to one embodiment of the invention shown in the block diagram of FIG. 2, an integrated circuit package 200 comprises a die 202 on a substrate 204 which is coupled to receive the $V^{++}$ and $V^{--}$ voltages. As shown in the embodiment of FIG. 2, the package is also coupled to receive the clock signal, $V_{cc}$, and ground at various terminals of the substrate. According to one embodiment, the noise generating circuit 102, the active decoupler logic 106, and the switches 108 and 110 may be implemented on the die 202. Alternatively, the noise generating circuit 102 may be implemented on the die 202, while the switches 108 and 110 may be implemented as discrete components on the substrate 204. As will be described in more detail in reference to FIG. 3, the noise generating circuit 102 and the switches 108 and 110 may be distributed over different elements of an electronic device, such as a printed circuit board.

Figure 3:
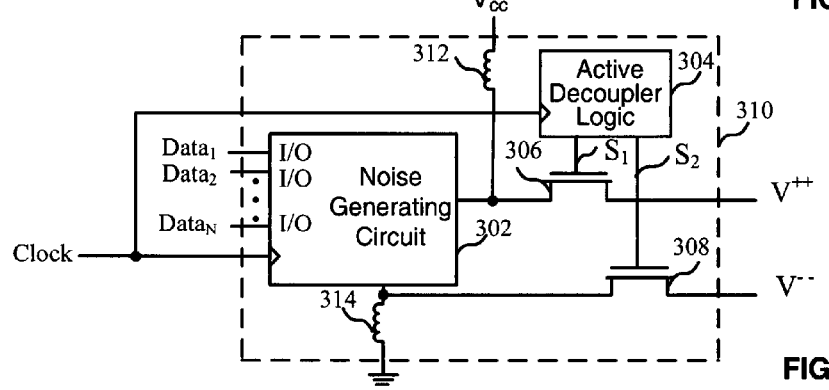
FIG. 3 is a block diagram of a circuit for suppressing noise according to an alternate embodiment of the present invention.

Turning now to FIG. 3, a noise generating circuit 302, active decoupler logic 304 and switches comprising transistors 306 and 308 may be distributed over various components of a device 310. In the embodiment of FIG. 3, $V^{++}$ is selectively coupled to the noise generating circuit 302 of a device 310 by transistor 306 having a gate controlled by a control signal $S_1$ from the active decoupler logic 304. Similarly, V" is selectively coupled to the circuit by a transistor 308 having a gate controlled by a control signal $S_2$. While the control signals $S_1$ and $S_2$ as shown are provided from the active decoupler logic 304 by way of example, the active decoupler logic 304 and/or the transistors 306 and 308 may be a part of the noise generating circuit 302. The parasitic inductance of the leads of the transistors at the $V_{cc}$ and ground nodes, which may vary depending upon the implementation of the device 310, is shown by inductors 312 and 314. Although metal oxide semiconductor circuits are shown by way of example, other types of transistors or switches could be employed according to the present invention. The noise generating circuit 302 may be incorporated as part of a microprocessor, a programmable logic device (PLD), an application specific integrated circuit (ASIC), a gate array, or any general-purpose design based on integrated circuit technology, or a printed circuit board implementing any of these devices coupled to transistors 306 and 308. For example, the noise generating circuit 302 may be implemented in silicon embedded in an integrated circuit, and the transistors implemented in discrete logic on a printed circuit board. Alternatively, all of the elements of the device 310 may also be implemented as stand-alone devices used to decouple noise or suppress electromagnetic radiated emissions in a digital, analog, or similar system. As will be described in more detail below in reference to FIG. 4, an active decoupling circuit, comprising the active decoupler logic 304 and the transistors 306 and 308, offers stable inductance and resistance over a wide range of operating frequencies and over a wide range of temperatures and voltages, and suppresses transient noise consistently over a wide operating frequency range.

Figure 4:
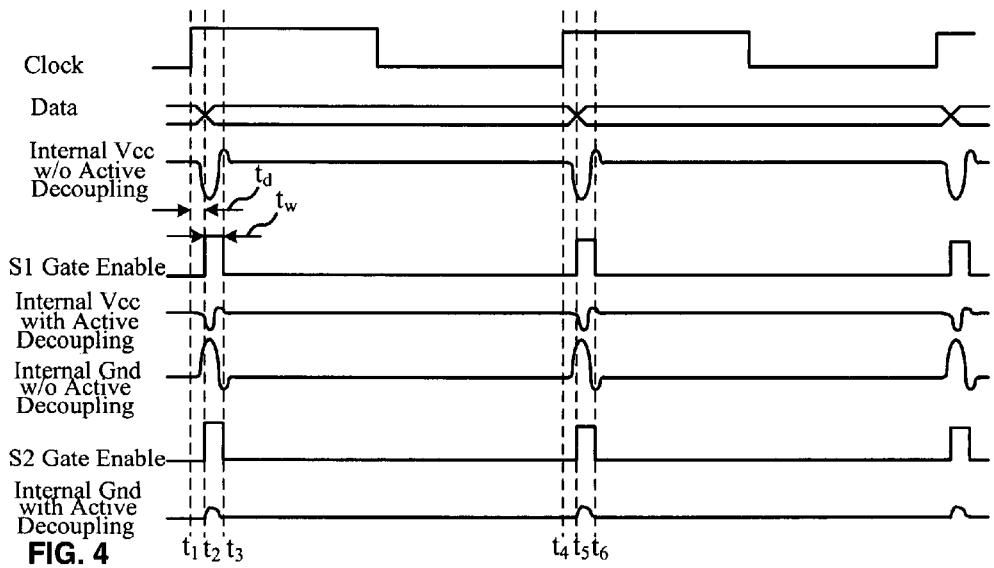
FIG. 4 is a timing diagram showing the operation of the circuits of FIGS. 1-3 according to an embodiment of the present invention.
Figure 7:
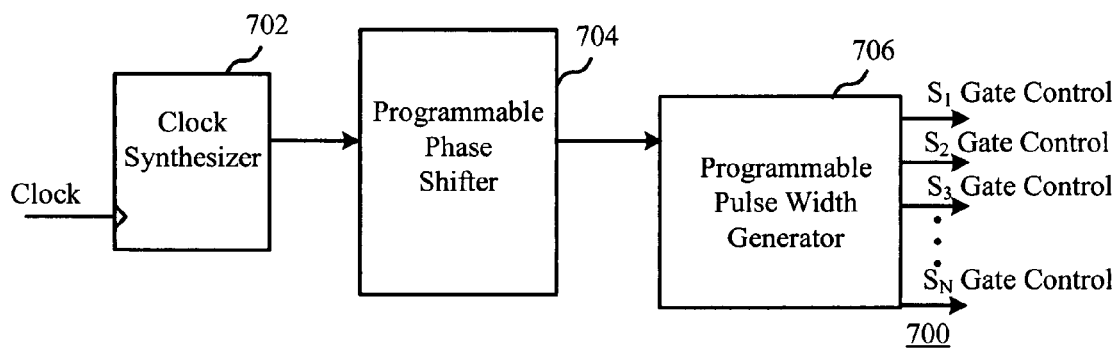
FIG. 7 is a circuit of the active decoupler logic for generating gate control signals according to an embodiment of the present invention.

Turning now to FIG. 4, a timing diagram shows the operation of the circuits of FIGS. 1-3. After a rising edge of the clock signal at a time $t_1$, data is latched at a terminal of the device, such as an input/output (I/O) pin of the device, at a time $t_2$. A pulse generator of the active decoupler logic 304, described in more detail in reference to FIG. 7, is referenced to the same clock that is used to drive switching logic of the noise generating circuit 302. However, the gate enable signal S1 may be delayed by a delay period $t_d$ until a time $t_2$. That is, any voltage droop of the supply voltage or spike in the ground voltage may be delayed because of circuit skew in the circuit, as is well known in the art. Accordingly, after the delay is determined, the delay period $t_d$ is set by the pulse generator to generate the pulse at time $t_2$. Similarly, the pulse width $t_w$ is determined depending upon duration of the droop or spike. The delay period $t_d$ and the pulse width $t_w$ comprising a predetermined portion of the clock period may vary depending upon a number of factors, including the type of device used and the circuit employed in the device. Accordingly, the delay period $t_d$ and pulse width $t_w$ are determined through testing and analysis of the device and circuit which is implemented in the device.

As shown in FIG. 4, the droop of the $V_{cc}$ signal for the circuit is significantly greater during the period between $t_2$ and $t_3$ without active decoupling than with active decoupling where the $V^{++}$ signal is coupled to $V_{cc}$ through switch 306. Similarly, the $S_2$ gate enable pulse causes the $V^{--}$ to be coupled to the ground voltage, where the bounce on the ground rail is significantly less during the period between $t_2$ and $t_3$ than without the application of $V^{--}$ to the ground terminal. Because devices implementing the circuit of FIGS. 1-3 track the clock that drives switching logic, they are able to synchronously suppress switching transient noise that is generated coincidentally with that clock. That is, the noise is decoupled synchronously with the clock signal based upon one or more signals which may be offset by a delay and have a predetermined pulse width. Further, the circuits of FIGS. 1-3 provide a new class of "active decoupling" devices having very low fixed inductance and resistance that perform well over a wide range of frequencies. Although the timing diagram in FIG. 4 is shown relative to the rising edge of the clock by way of example, the active decoupler could be designed to work with the falling edge of the clock, or with both clock edges.

Figure 5:
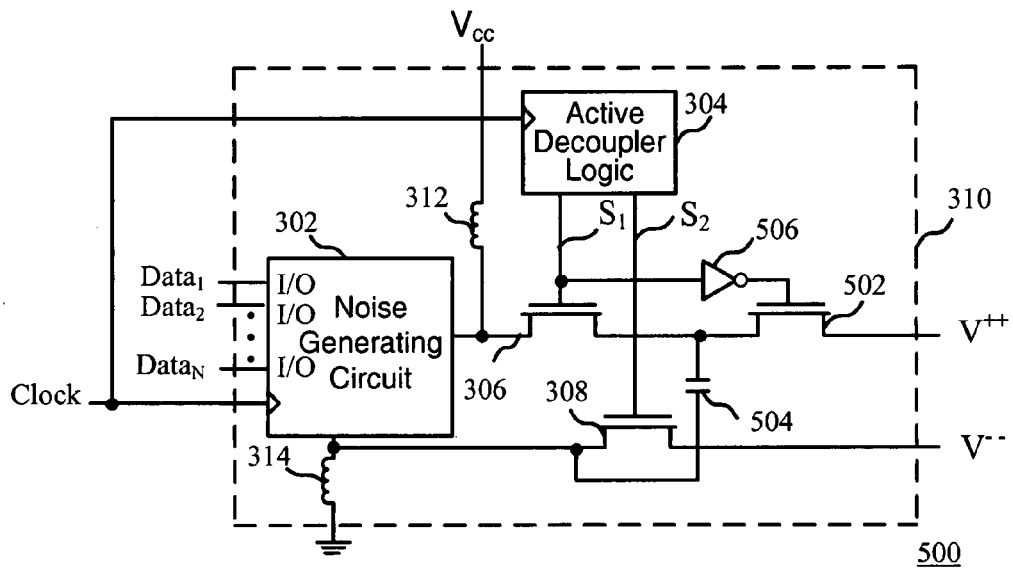
FIG. 5 is a block diagram of a circuit having a capacitor for suppressing noise at a voltage supply according to an embodiment of the present invention.

Turning now to FIG. 5, a block diagram of a circuit having a capacitor for suppressing noise at a voltage supply according to an alternate embodiment of the present invention is shown. The circuit of FIG. 5 is similar to the circuit of FIG. 3 except that an additional transistor 502 is coupled to the transistor 306, and a capacitor 504 is coupled at the node coupling the transistors 502 and 306. An inverter 506 is coupled to receive the control signal which controls transistor 306 and to generate an inverted signal to control the transistor 502. As can be seen, $V^{++}$ is used to pre-charge the capacitor 504 when transistor 502 is on and transistor 306 is off. When the additional voltage is necessary to be applied to $V_{cc}$, transistor 306 is turned on and transistor 502 is turned off. Accordingly, the charge on the capacitor is used to provide the additional charge necessary to prevent voltage droop in the supply voltage $V_{cc}$. Although an inverter is shown by way of example, other devices may be used to control the gate of the transistor 502, or signals which are generated independently may be employed to control the transistors 306 and 502.

Figure 6:
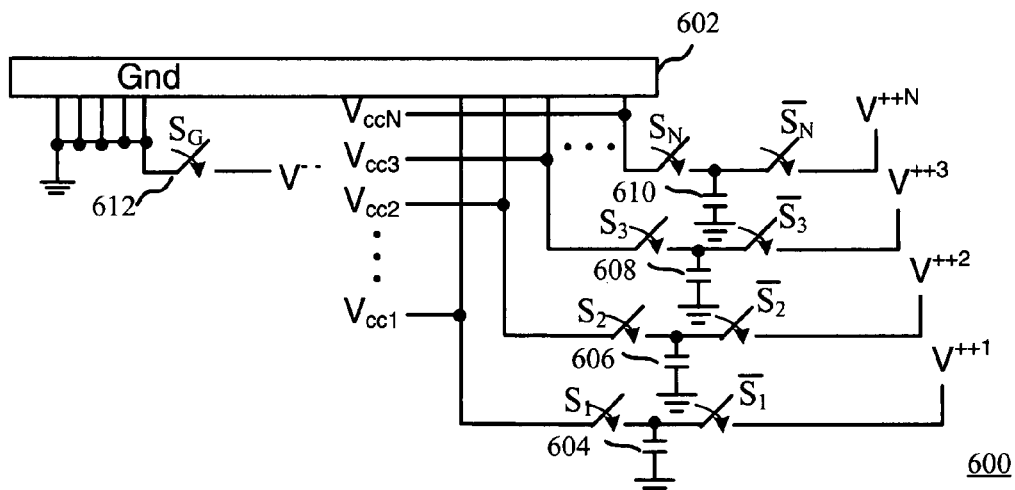
FIG. 6 is a block diagram of a circuit for suppressing noise in a device having a plurality of supply voltages according to an embodiment of the present invention.

Turning now to FIG. 6, a block diagram of a circuit for suppressing noise in a device having a plurality of supply voltages according to an embodiment of the present invention is shown. As shown in the circuit of FIG. 6, a device 602, such as an integrated circuit or printed circuit board, may comprise a plurality of supply voltages, shown here as $V_{cc1}$-$V_{ccN}$. Each supply voltage may be coupled to a greater voltage to prevent droop in the supply voltage as described above. In particular, the supply voltages $V_{cc1}$-$V_{ccN}$ may be coupled to a voltages $V^{++1}$-$V^{++N}$, respectively. A plurality of switches may be employed in the paths between the supply voltage and the corresponding greater voltage. For example, a capacitor 604 may be coupled to a node between a first switch $S_1$ and a second switch/$S_1$. Voltage droop may be avoided in the supply voltage as described above with respect to FIG. 5 by selectively charging the capacitor to a voltage greater than the supply voltage, and coupling the capacitor to the supply voltage during switching. Capacitors 606-610 may also be coupled to nodes between first and second switches associated with supply voltages $V_{cc2}$-$V_{ccN}$, respectively. Finally, a switch 612 may be used to couple ground to a greater negative voltage to prevent ground bounce, as described above. Although only one ground and one switch 612 are shown, additional switches could be employed for other isolated grounds on the same device. The circuit of FIGS. 1-6 may be used either as stand alone or in conjunction with passive decoupling devices, such as decoupling capacitors.

Turning now to FIG. 7, a circuit of the active decoupler logic for generating gate control signals according to an embodiment of the present invention is shown. In particular, a clock synthesizer 702 receives a clock signal, and generates a clock signal which is coupled to a programmable phase shifter 704. The programmable phase shifter 704 will generate a phase shifted clock signal which is shifted based upon the time delay $t_d$. The phase shifted clock signal is coupled to a programmable pulse width generator 706 which generates a pulse starting at the rising edge of the phase shifted clock signal and ending after a predetermined pulse width. As described above, the pulse width represents the approximate duration $t_w$ of the voltage droop or ground bounce, and is determined based upon the device being used and the circuit which is employed. The programmable pulse width generator may consist of a Delay Locked Loop (DLL) or similar clock recovery circuitry, a fixed or variable delay element, a self-timing element, or other gating logic. As shown, each of the separate gate control signals $S_1$-$S_N$ may be generated separately.

Figure 8:
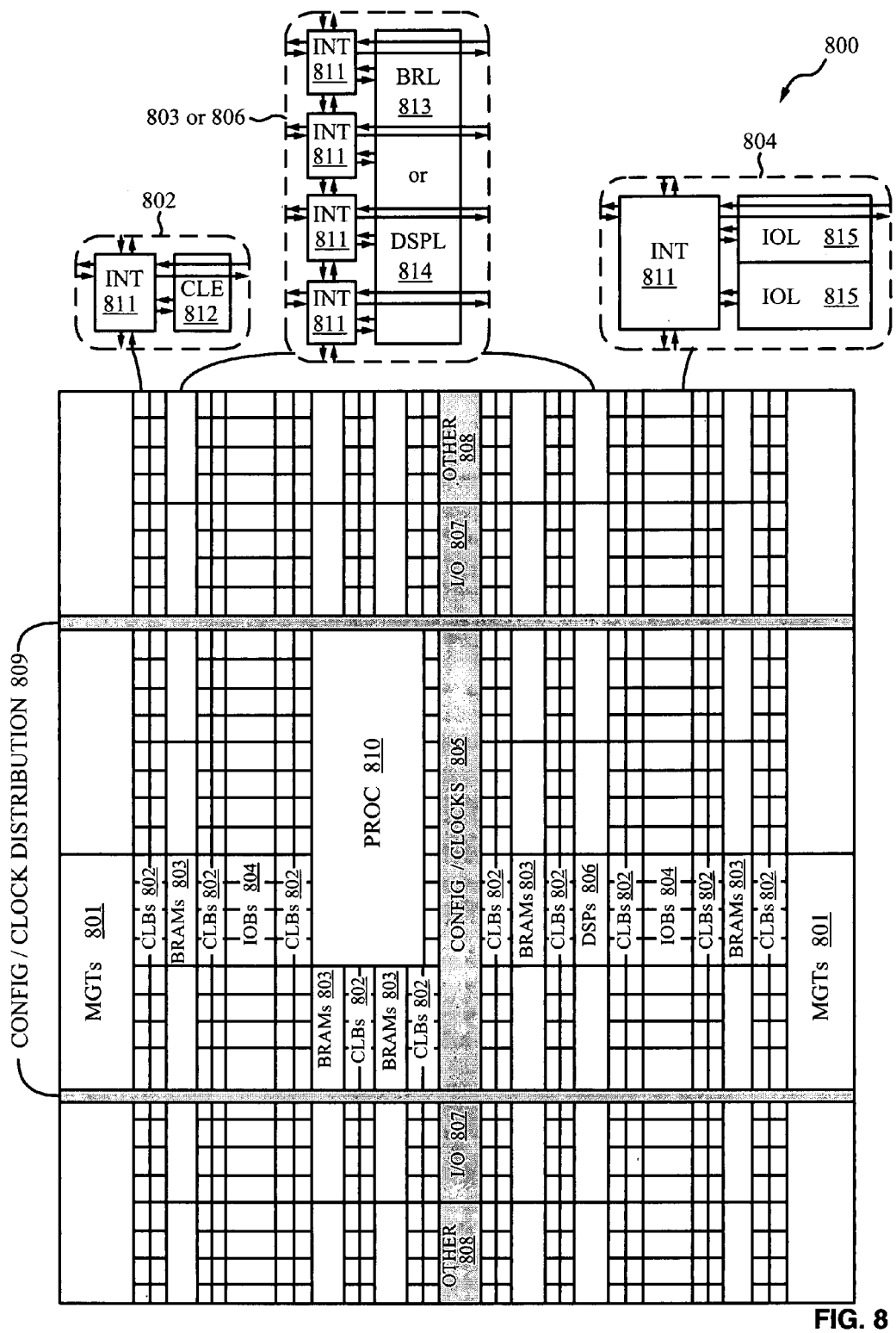
FIG. 8 is a block diagram of a programmable logic device according to an embodiment of the present invention.

Turning now to FIG. 8, a block diagram of a programmable logic device according to an embodiment of the present invention is shown. A programmable logic device is one type of integrated circuit which is designed to be user-programmable so that users may implement logic designs of their choices. One type of programmable logic device is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources.

FIG. 8 shows an FPGA architecture 800 which includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include dedicated processor blocks (PROC 810). The active decoupling circuits of FIGS. 1-3 and 5-6 may be implemented in the FPGA, or coupled to a supply voltage pin and ground pin of the FPGA, as described above.

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 812) that may be programmed to implement user logic plus a single programmable interconnect element (INT 811). A BRAM 803 may include a BRAM logic element (BRL 813) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811).

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic. While an FPGA is shown in detail as one type of programmable logic device by way of example, the circuits and methods of the present invention may be implemented in any device, including any type of integrated circuit having programmable logic.

Figure 9:
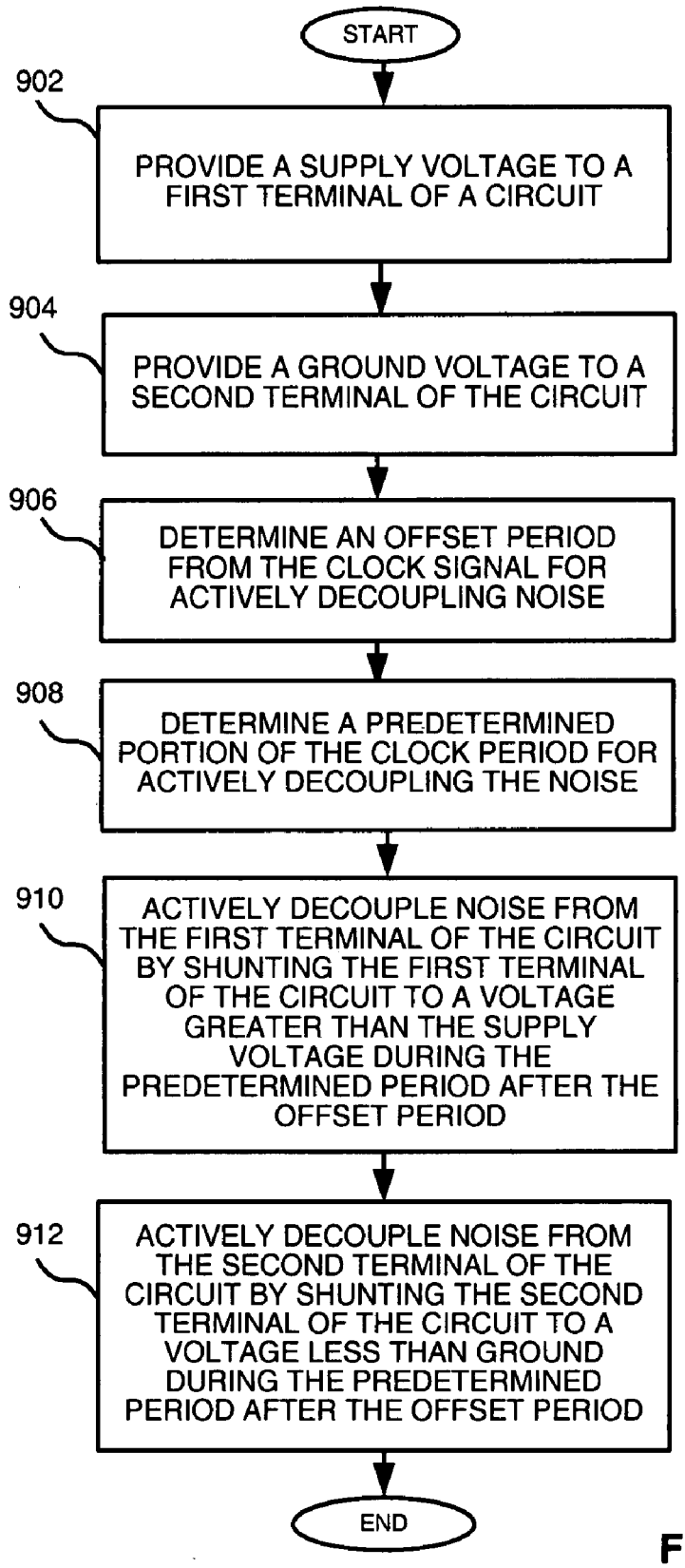
FIG. 9 is a flow chart showing a method of suppressing noise according to an embodiment the present invention.

Turning now to FIG. 9, a flow chart shows a method of suppressing noise according to an embodiment the present invention. In particular, a supply voltage is provided to a first terminal of the circuit at a step 902. A ground voltage is provided to a second terminal of the circuit at a step 904. An offset period from the clock signal is determined for actively decoupling noise at a step 906. A predetermined portion of the clock period is determined for actively decoupling the noise at a step 908. Noise is actively decoupled from the first terminal of the circuit by shunting the first terminal of the circuit to a voltage greater than the supply voltage during the predetermined period after the offset period at a step 910. Noise is actively decoupled from the second terminal of the circuit by shunting the second terminal of the circuit to a voltage less than ground during the predetermined period after the offset period at a step 912. The method of FIG. 9 may be implemented using any of the circuits of FIGS. 1-3 and 5-6 as described above, or any other suitable circuit.

It can therefore be appreciated that a novel method of and circuit for suppressing noise has been described. The invention described above is a new method to suppress power supply noise in a digital or analog switching system. The active decoupling method and circuit described above uses circuitry that suppresses transient voltage droop and ripple that are generated by switching logic. It offers fixed parasitic inductance and resistance over a wide temperature, voltage, and frequency range. While the circuits described above are shown by way of example, the circuits and methods could be implemented with any type of circuit or device to avoid voltage droop or bounce. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of suppressing noise in a circuit, the method comprising:

providing a supply voltage to a first terminal of the circuit;

providing a ground voltage to a second terminal of the circuit;

providing a clock signal to the circuit, the clock signal having a state for switching outputs of the circuit defined by a rising edge and a falling edge of the clock signal; and actively decoupling noise from at least one of the first terminal and the second terminal of the circuit by actively decoupling noise synchronously with the clock signal, wherein actively decoupling noise comprises shunting the first terminal of the circuit to a voltage greater than the supply voltage, and shunting the second terminal of the circuit to a voltage less than the ground voltage during a predetermined portion of the clock signal which is less than the state for switching outputs of the circuit defined by the rising edge and the falling edge.

2. The method of claim 1 wherein actively decoupling noise comprises providing a pulse having an offset from one of the rising edge or the falling edge of the clock signal for actively decoupling noise.

3. The method of claim 1 wherein actively decoupling noise comprises actively decoupling noise during a predetermined portion of the state for switching outputs of the circuit.

4. The method of claim 1 further comprising charging a capacitor to a predetermined voltage greater than the supply voltage, wherein actively decoupling noise comprises shunting the first terminal to the capacitor.

5. A method of suppressing noise in a circuit, the method comprising:

providing a supply voltage to a first terminal of the circuit;

providing a ground voltage to a second terminal of the circuit;

determining at least one of a duration of a droop in the supply voltage and a duration of a spike in the ground voltage during operation of the circuit;

determining a pulse width of a shunt enable signal based upon the at least one of a duration of a droop in the supply voltage and a duration of a spike in the ground voltage; and actively decoupling noise from at least one of the first terminal and the second terminal of the circuit by selectively shunting the at least one of the first terminal and the second terminal to a voltage having a greater magnitude for a period equal to the pulse width of the shunt enable signal during switching of a signal at an output of the circuit.

6. The method of claim 5 further comprising providing a clock signal to the circuit, wherein active decoupling noise comprises decoupling noise synchronously with the clock signal.

7. The method of claim 6 wherein selectively shunting the at least one of the first terminal and the second terminal comprises selectively shunting the at least one of the first terminal and the second terminal after a predetermined offset from the clock signal.

8. The method of claim 6 wherein selectively shunting the at least one of the first terminal and the second terminal comprises selectively shunting the at least one of the first terminal and the second terminal during a predetermined portion of a clock period of the clock signal.

9. The method of claim 5 wherein actively decoupling noise comprises shunting the first terminal to a voltage greater than the supply voltage and shunting the second terminal to a voltage less than ground.

10. The method of claim 9 wherein shunting the first terminal to a voltage greater than the supply voltage comprises pre-charging a capacitor to a voltage greater than the supply voltage and shunting the supply voltage to the capacitor.

11. The method of claim 5 wherein actively decoupling noise from the first terminal comprises shunting, for each supply voltage signal of a plurality of supply voltage signals, the supply voltage to a voltage greater than the supply voltage.

12. A circuit for suppressing noise at a terminal, the circuit comprising:
   a clock signal coupled to a clock input, the clock signal having a state for switching outputs of the circuit defined by a rising edge and a falling edge of the clock signal;
   a supply voltage coupled to a first terminal;
   a ground voltage coupled to a second terminal; and
   a switching circuit coupled to at least one of the first terminal and the second terminal to actively decouple noise from the at least one of the first terminal and the second terminal of the circuit by actively decoupling noise synchronously with the clock signal,
   wherein actively decoupling noise comprises shunting the first terminal of the circuit to a voltage greater than the supply voltage, and shunting the second terminal of the circuit to a voltage less than the ground voltage during a predetermined portion of the clock signal which is less than the state for switching outputs of the circuit defined by the rising edge and the falling edge.

13. The device of claim 12 wherein the switching circuit comprises a first switch coupled between the first terminal and a voltage which is greater than the supply voltage.

14. The device of claim 13 wherein the switching circuit comprises a second switch coupled at a node between the first switch and the voltage which is greater than the supply voltage, and a capacitor coupled to the node,
   wherein the first terminal is shunted to the capacitor when decoupling noise from the first terminal.

15. The device of claim 13 wherein the switching circuit comprises a second switch coupled between the second terminal and a voltage which is less than ground.

16. The device of claim 12 further comprising a programmable pulse generator for adjusting the phase and pulse width of a pulse for decoupling noise synchronously with the clock signal.

17. The device of claim 12 wherein the circuit comprises a programmable device.

18. The method of claim 1 further comprising determining the predetermined portion of the clock signal based upon at least one of a duration of a droop in the supply voltage and a duration of a spike in the ground voltage.

19. The method of claim 1 wherein shunting the first terminal and the second terminal during the predetermined portion of the clock signal comprises shunting the first terminal and the second terminal during a period determined by a droop in the supply voltage during operation of the circuit.

20. The method of claim 1 wherein shunting the first terminal and the second terminal during the predetermined portion of the clock signal comprises shunting the first terminal and the second terminal during a period determined by a spike in the ground voltage during operation of the circuit.

* * * * *